United States Patent
Lee et al.

(10) Patent No.: US 8,569,138 B2
(45) Date of Patent: Oct. 29, 2013

(54) DRAIN EXTENDED MOS TRANSISTOR AND METHOD FOR FABRICATING THE SAME

(75) Inventors: Hee Bae Lee, Seoul (KR); Choul Joo Ko, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 13/543,252

(22) Filed: Jul. 6, 2012

(65) Prior Publication Data

US 2013/0168766 A1    Jul. 4, 2013

(30) Foreign Application Priority Data

Dec. 30, 2011  (KR) .................. 10-2011-0146747

(51) Int. Cl.
*H01L 21/336* (2006.01)
(52) U.S. Cl.
USPC ................................ 438/286; 257/E21.427
(58) Field of Classification Search
None
See application file for complete search history.

(56) References Cited

U.S. PATENT DOCUMENTS

| | | | |
|---|---|---|---|
| 6,303,961 B1 * | 10/2001 | Shibib | 257/335 |
| 2003/0173624 A1 | 9/2003 | Choi et al. | |
| 2006/0124999 A1 * | 6/2006 | Pendharkar | 257/335 |
| 2011/0309443 A1 * | 12/2011 | Huang et al. | 257/343 |

FOREIGN PATENT DOCUMENTS

| | | |
|---|---|---|
| KR | 1997-0053921 | 7/1997 |
| KR | 10-2003-0070264 | 8/2003 |
| KR | 10-2008-0033423 | 4/2008 |
| WO | WO 2007/011354 | 1/2007 |
| WO | WO 2007/011354 A1 | 1/2007 |

* cited by examiner

*Primary Examiner* — Michael Lebentritt
*Assistant Examiner* — Kevin Quinto
(74) *Attorney, Agent, or Firm* — Sherr & Jiang, PLLC

(57) ABSTRACT

A drain extended MOS (DEMOS) transistor including at least one of: (1) A p-type epitaxial layer grown over an n-type semiconductor substrate. (2) An n-type well formed in a portion of the epitaxial layer. (3) A p-type drift region formed in another portion of the epitaxial layer. (4) A p-type source region formed in the well. (5) A p-type drain region formed in the drift region and spaced apart from the source region inside the epitaxial layer. (6) An n-type channel region extending between the drift region and the source region. (7) A gate structure formed over the channel region. (8) An n-type buried layer having a contact surface with the well and the drift region and formed in the epitaxial layer. A region of the buried layer has surface contact with the drift region and has a relatively low dopant concentration compared to other regions.

4 Claims, 7 Drawing Sheets

DRAIN EXTENDED MOS TRANSISTOR AND METHOD FOR FABRICATING THE SAME

This application claims priority under 35 U.S.C. 119 AND 35 U.S.C. 365 to Korean Patent Application No. 10-2011-0146747 (filed on Dec. 30, 2011), which is hereby incorporated by reference in its entirety.

BACKGROUND

For high-power switching applications, power semiconductor products may often be fabricated using N-channel or P-channel DEMOS transistor devices (e.g. a lateral double diffused MOS (LDMOS) device or a reduced surface field (RESURF) transistor). Drain extended MOS field effect transistors (i.e. a DEMOS transistors) with extended drain regions may attempt to maximize the breakdown voltage (BV) characteristics of the transistor device.

A DEMOS transistor may combine short-channel operation with relatively high current handling capabilities, relatively low drain-to-source on-state resistance (Rdson), and/or the ability to withstand relatively high blocking voltages without suffering voltage breakdown. BV may be measured as drain-to-source breakdown voltage (BVdss) with the gate and source short-circuited together. In some designs, a DEMOS device is designed around a tradeoff between breakdown voltage BVdss and Rdson. In addition to performance advantages, DEMOS device fabrication may be relatively easy to integrate into CMOS process flows, facilitating use in devices where logic, low power analog, and/or other circuitry may be fabricated in a single integrated circuit (IC).

A P-channel DEMOS (DEPMOS) transistor may include a p-type source formed in an n-well, where the n-well includes an n-type channel region between the source and an extended p-type drain. An extended drain may include an n-type drain into which impurity ions are implanted at a high concentration in p-well and a p-type drift region in a p-well extending between a channel region and the drain. Low p-type doping on the drain side may provide a large depletion layer with a relatively high blocking voltage capability. A n-well may be connected by an n-type back-gate connection to prevent or minimize the n-well from floating. Accordingly, a device threshold voltage (Vt) may be stabilized. The drain region of the device may be spaced from the channel (e.g. extended) to provide a drift region and/or an extended drain in the p-type semiconductor material between the channel and the drain. In operation, the spacing of the drain and the channel may spread out the electric field, thereby maximizing the breakdown voltage rating of the device (e.g. facilitate a relatively high breakdown voltage BVdss). However, the drain extension maximizes the Rdson (i.e. drain-to-source on-state resistance). Accordingly, the design of a DEMOS transistor often involves a difficult tradeoff between high BVdss and low Rdson.

DEMOS devices may be widely used for power switching applications requiring relatively high blocking voltages and/or relatively high current carrying capabilities (e.g. when solenoids or other inductive loads are to be driven). In one possible configuration, two or four n-channel DEMOS devices may be arranged as a half or full H-bridge circuit to drive a load. In a half H-bridge arrangement, two DEMOS transistors may be coupled in series between a supply voltage VCC and ground with a load coupled to the ground from an intermediate node between the two transistors. In such a configuration, the transistor between the intermediate node and the ground may be referred to as a 'low-side' transistor and the transistor between the voltage source and intermediate node may be referred to as a 'high-side' transistor. The transistors may be alternately activated to provide current to the load. A full H-bridge circuit may include two high-side transistors and two low-side transistors with the load being coupled between two intermediate nodes.

In operation, a high-side DEMOS transistor may have a drain coupled to the supply voltage and a source coupled to the load. In an 'on-state', a high-side transistor may conduct current from the supply voltage to the load, wherein the source may be essentially pulled up to the supply voltage. Some DEMOS devices may be fabricated in a wafer having a p-doped silicon substrate with an epitaxial silicon layer formed over the substrate. The substrate may be grounded and the source, drain, and channel (e.g. including an n-well and p-well) of the transistor may be formed in the epitaxial silicon layer.

In order to prevent a punch-through current between the p-well and the substrate during the on-state for high-side DEMOS device, it may be desirable to separate the p-well that surrounds the source from the underlying p-type substrate that is grounded. Although the n-well may extend under the p-well, the n-well may only be lightly doped. Therefore, the n-well may not provide an adequate barrier to the on-state punch-through current from the source to the substrate. Accordingly, a highly doped n-buried layer (NBL) may sometimes be formed in the substrate prior to forming the epitaxial silicon layer to separate the n-well from the substrate and may thereby inhibit on-state punch-through current from the p-well to the substrate in high-side DEMOS devices.

A NBL (n-buried layer) may be connected to a drain terminal of the high-side DEMOS device by a deep diffusion or sinker and may be tied to the supply voltage which may prevent the on-state punch-through current. Although the NBL may operate to prevent the on-state punch-through current, the NBL may limit the off-state BREAKDOWN VOLTAGE rating of high-side DEMOS device. In an "off" state, the high-side transistor source may essentially pulled down to ground. The low-side transistor may enter a conductive state and a drain-to-source voltage across the high-side DEMOS device may essentially he the supply voltage VCC. In high-voltage switching applications, the presence of the n-buried layer under the p-well limits the drain-to-source breakdown of the device as the n-buried layer is tied to the drain at VCC. In this situation, the p-well is at ground, since the source is low in the off-state, and the supply voltage (VCC) is essentially dropped across the n-well portion extending between the bottom of the p-well and the n-buried layer and between the channel-side of the p-well and the drain. As the high-side driver is shut off when driving an inductive load, the transient drain-to-source voltage may increase beyond the supply voltage level VCC.

Hereafter, a DEMOS transistor will be described with reference to accompanying drawings. FIG. 1 illustrates full H-bridge driver semiconductor device 2, powered by a DC supply voltage (VCC), in accordance with embodiments. For example, semiconductor device 2 may be fabricated as a single IC having four driver transistors T1 to T4, an external connection for power and gate signals, a load terminal, and/or may selectively provide a connection to an external diode for high-side transistors T2 and/or T3.

As shown in FIG. 1, semiconductor device 2 may include four p-channel DEMOS (DEPMOS) devices T1 to T4 having sources SI to S4, drains D1 to D4, and gates G1 to G4, coupled in an H-bridge to drive a load coupled between intermediate nodes N1 and N2. The transistors T1 to T4 may be arranged as a pair of low-side transistors T1 and T4 and another pair of high-side transistors T2 and T3 which have the load coupled between the intermediate nodes, thereby forming an "H-shaped" circuit. A half bridge driver circuit may be implemented using transistors T1 and T2. In this case, node N2 on the right side of the load may be coupled to ground, whereby transistors T3 and T4 would be omitted. In automotive applications, portable electronic devices and/or other similar device (as mere examples), a supply voltage VCC may serve as a positive terminal of a battery and ground may serve as a negative terminal of the battery.

On the left side of the H-bridge in FIG. 1, low-side transistor T1 and high-side transistor T2 are coupled in series between the supply voltage VCC and the ground. Low side transistor T4 and high side transistor T3 may be coupled in a similar manner. High-side transistor T2 may have drain D2 coupled to supply voltage VCC and source S2 coupled to intermediate node N1 at the load. Low-side transistor T1 may have drain D1 coupled to node N1 and source S1 coupled to ground. Node N1 between transistor T1 and transistor T2 may be coupled to a first terminal of the load and node N2 at the other load terminal may be coupled to the transistor T3 and transistor T4. In some situations, the load is not part of semiconductor device 102. High-side transistor gate G1 and low-side transistor gate G4 may be controlled to drive the load in an alternating manner. When transistor T2 and transistor T4 are turned on, current may flow in a first direction (e.g. the right direction in FIG. 1) through high-side transistor T2, the load, and transistor T4. Similarly, when both transistor T3 and transistor T1 are turned on, current may flow in a second direction (the left direction in FIG. 1) through transistor T3, the load, and low-side transistor T1.

To understand at least one disadvantage of related art DEMOS transistors in applications such as the H-bridge of FIG. 1, FIG. 2 provides a cross-sectional view of semiconductor device 2 having an example high-side DEMOS transistor 3, in accordance with the related art. DEMOS transistor 3 may be coupled to drive a load in a full or half-bridge driver circuit configuration, such as transistor T2 in H-bridge circuit in FIG. 1.

Referring to FIG. 2, semiconductor device 2 includes p-doped silicon substrate 4 having epitaxial silicon layer 6 formed thereon. NBL 20 (n-buried layer) may be positioned in the silicon substrate 4 under the DEMOS transistor 3, and partially extended into the epitaxial silicon layer 6. N-type dopants may be implanted into part of epitaxial silicon layer 6 above NBL 20, thereby forming n-well 8. Field oxide (FOX) layer 10 may be formed in the upper portion of epitaxial silicon layer 6. N-type back gate (BG) 12 and p-type source 14 may be formed in n-well 8 and p-type drain 16 may be formed in p-drift region 6a. A gate structure including gate oxide 18 and gate electrode 20 may be formed over channel region 21 of n-well 8. For illustrative purposes, gate G2, source S2, and drain D2 of high-side DEMOS transistor 3 may be represented as if they are coupled to form the half or full bridge driver circuit as in FIG. 1.

In some driver applications, drain 16 of high-side DEMOS transistor 3 may be coupled to supply voltage VCC and source 14 thereof may be coupled to the load at intermediate node N1. When high-side DEMOS transistor 3 is turned on, both source 14 and drain 16 may be at or near supply voltage VCC. NBL 20 may help to prevent a punch-through current from flowing between n-well 8 and grounded p-type silicon substrate 4 and NBL may be electrically coupled to drain 16 (e.g. VCC). However, when high-side DEMOS transistor 3 is turned off, source 14 is essentially pulled down to ground through the low-side transistor, whereby a drain-to-source voltage across high-side DEMOS transistor 3 substantially corresponds to supply voltage VCC. When high-side DEMOS transistor 3 is switched from the 'on state' to the 'off state', the drain-to-source voltage temporarily becomes relatively large compared to supply voltage VCC.

At least a portion of the above-described regions may be susceptible to breakdown at higher supply voltages than in the off state of the high-side DEMOS transistor, due to NBL 20 located under p-drift region 6a, wherein the breakdown voltage (BVdss) of a related art high-side DEMOS transistor 3 is relatively low. Therefore, while NBL 20 inhibits on-state punch-through current from p-drift region 6a to silicon substrate 4, the off-state BVdss of high-side DEMOS transistor 3 may be limited by NBL 20.

Without changes in design from the related art discussed above, supply voltage VCC may not be maximized without risk of off-state or transient voltage breakdown. One approach in the related art for maximizing breakdown voltage performance is to reduce the dopant concentration of p-drift region 6a. However, this approach maximizes Rdson, thereby having an adverse effect on an on-state drive current. Another approach in the related art for maximizing BREAKDOWN VOLTAGE performance is to maximize the thickness of epitaxial silicon layer 6. However, as discussed above, when epitaxial layer 6 is formed to a relatively large thickness, the fabrication process may become complex.

SUMMARY

Embodiments relate to a semiconductor device and a method for fabricating a semiconductor device including a drain extended MOS (DEMOS) transistor capable of increasing a breakdown voltage rating without increasing a drain-to-source on-state resistance (Rdson) or the thickness of an epitaxial silicon layer. Embodiments relate to a DEMOS transistor capable of maximizing a breakdown voltage rating without maximizing the drain-to-source on-state resistance (Rdson) and/or maximizing the thickness of an epitaxial silicon layer. Embodiments provide a DEMOS transistor capable of avoiding or relieving tradeoffs between Rdson and breakdown voltage in the DEMOS transistor without significantly changing a related art fabrication process.

In accordance with embodiments, a DEMOS transistor may include at least one of: (1) A p-type epitaxial layer grown over an n-type semiconductor substrate. (2) An n-type well formed in a portion of the epitaxial layer. (3) A p-type drift region formed in the other portion of the epitaxial layer. (4) A p-type source region formed in the well. (5) A p-type drain region formed in the drift region and spaced in a lateral direction from the source region inside the epitaxial layer. (6) An n-type channel region expanded between the drift region and the source region. (7) A gate structure formed over the channel region. (8) An n-type buried layer having a contact surface with the well and the drift region formed in the epitaxial layer.

A region of the buried layer, which has a contact surface with the drift region, may have a lower dopant concentration than other regions, in accordance with embodiments. The DEMOS transistor may include another p-type buried layer formed in the epitaxial layer between the well and the buried layer, in accordance with embodiments.

In accordance with embodiments, a method for fabricating a DEMOS transistor may include at least one of the following: (1) Providing a p-type silicon substrate. (2) Forming an n-type buried layer having different concentration distributions in a portion of the silicon substrate. (3) Forming an epitaxial silicon layer over the silicon substrate. (4) Defining an n-type well and a p-type drift region inside the epitaxial silicon layer. (5) Forming a p-type of source region and an n-type back gate in the well. (6) Forming a p-type of extended drain and source regions in the drift region.

During the formation of the buried layer, the buried layer may be formed in such a manner that a first region that is adjacent to the drift region has a relatively lower dopant concentration than a second region outside of the first region, in accordance with embodiments.

In embodiments, the formation of the n-type buried layer may include at least one of the following: (1) Forming a pattern which opens a portion of the silicon substrate corresponding to the first region and the top of the silicon substrate corresponding to the second region. (2) Forming a guard ring in the first region and forming a dopant region in the second region by performing an n-type dopant ion implantation process using the pattern. (3) Removing the pattern and performing a thermal diffusion process to form the buried layer of which the first region has a lower dopant concentration than the second region. In embodiments, the forming of the second-conductive-type buried layer may include forming another p-type buried layer between the n-type well and the second region.

DRAWINGS

The above and other objects and features of the embodiment will become apparent from the following description of embodiments given in conjunction with the accompanying drawings, in which:

FIG. 1 schematically illustrates a full H-bridge circuit for driving a load using two pairs of low and high-side DENMOS devices, in accordance of the related art.

DESCRIPTION

Embodiment will be described in detail with reference to the accompanying drawings so that they can be readily implemented by those skilled in the art.

Embodiments relate to a DEMOS transistor which may include a diode coupled to an extended drain and a method for fabricating the same, such that performance characteristics of the DEMOS transistor may be optimized. In embodiments, a relatively high breakdown voltage rating may be accomplished without having to unnecessarily maximize the thickness of an epitaxial silicon layer and/or a buried layer. Embodiments relate to special applications of a high-side transistor in a full or half bridge circuit. However, a DEMOS transistor and a method for fabricating the same in accordance with embodiment are not limited to such applications. In embodiments, a PMOS driver transistor is used as a mere example in the following description, but embodiments are not intended to be limited to a PMOS driver transistor. For example, in embodiments, an NMOS driver transistor having an n-doped region instead of a p-doped region may be implemented. In embodiments, a semiconductor body having a silicon substrate and an epitaxial silicon layer positioned over the silicon substrate may be used to form a semiconductor device which is described below. However, other semiconductor bodies including a standard semiconductor wafer, an SOI wafer and/or similar devices may be used in accordance with embodiments.

Figure 3:
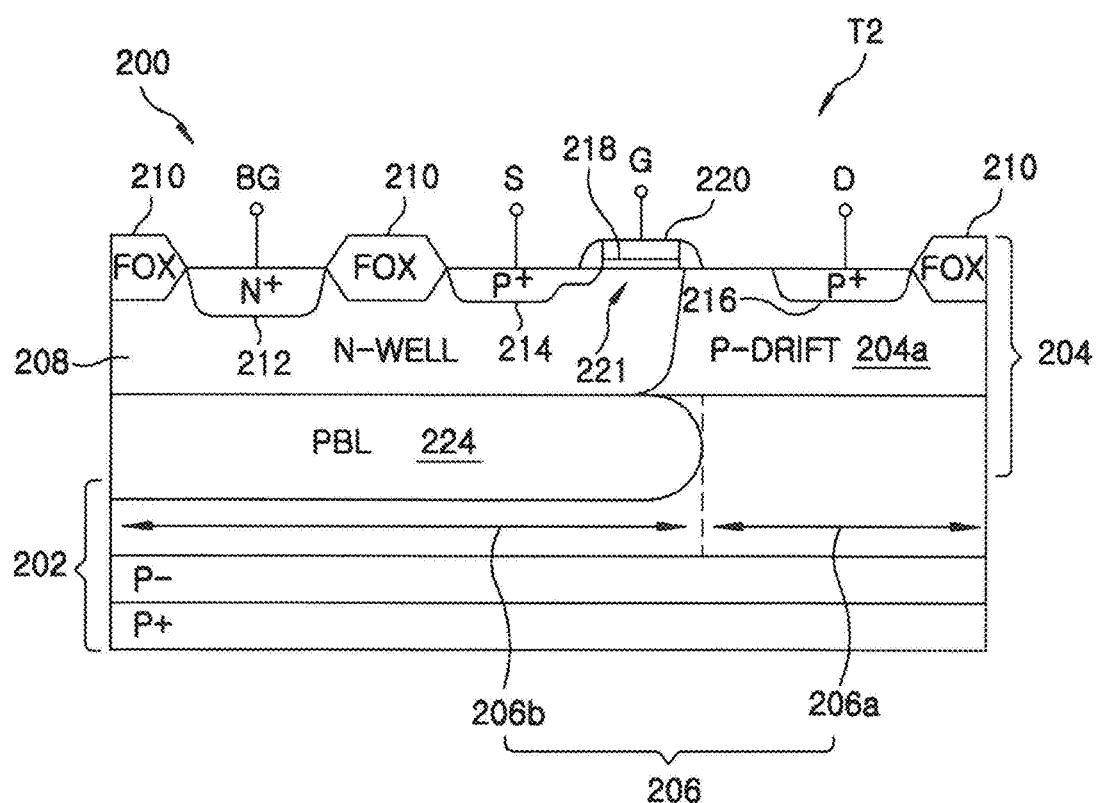
FIG. 3 is a cross-sectional view of a p-channel DEMOS transistor, in accordance with embodiments.

A DEMOS transistor in accordance with embodiments is described with reference to the accompanying drawings. FIG. 3 illustrates p-channel DEMOS transistor T2 in H-bridge driver semiconductor device 200, accordance with embodiments. In embodiments, a breakdown voltage may be optimized through NBL 206 having different concentration distributions, without unnecessary thickness of an epitaxial layer. FIG. 3 is a cross-sectional view of a DEMOS transistor in accordance with embodiments (e.g. a p-channel DEMOS transistor).

As illustrated in FIG. 3, semiconductor device 200 may he formed in a semiconductor body including p-doped silicon substrate 202 and epitaxial silicon layer 204 formed over silicon substrate 202, in accordance with embodiments. In embodiments, NBL 206 may be positioned inside silicon substrate 200 and partially extended into epitaxial silicon layer 204. N-well 208 may be formed by an n-type dopant ion implantation process for a portion of the epitaxial silicon layer 204 over NBL 206. In embodiments, the other portion (s) of epitaxial silicon layer 204 (i.e. regions adjacent to n-well 208) may be used as p-drift region 204a.

Field oxide (FOX) 210 may be formed in an upper portion of epitaxial silicon layer 204. N-type back gate region 212 and p-type source region 214 may be formed in n-well 208. P-type drain region 216 may be formed in p-drift region 202a. A gate structure including gate oxide 218 and gate electrode 220 may be formed over channel region 221 inside n-well 208.

In embodiments, NBL 206 may include first NBL 206a coupled to p-drift region 204a and second NBL 206h coupled to n-well 208. The n-type dopant concentration of first NBL 206a may be lower than second NBL 206b, in accordance with embodiments. Since the dopant concentration of first NBL 206a may be relatively low compared to a related art DEMOS transistor, a depletion layer region of a PN junction between p-drift region 204a and NBL 206 may be extended, in accordance with embodiments. With an extension of a depletion layer, a breakdown voltage (internal voltage) between drain region 216 and NBL 206 may be optimized and/or maximized. In embodiments, a p-channel DEMOS transistor may include p-buried layer (PBL) 224 for isolation between n-type back gate region 212 and second NBL 206b. PBL 224 may be formed between second NBL 206b and n-well 208.

Figure 1:
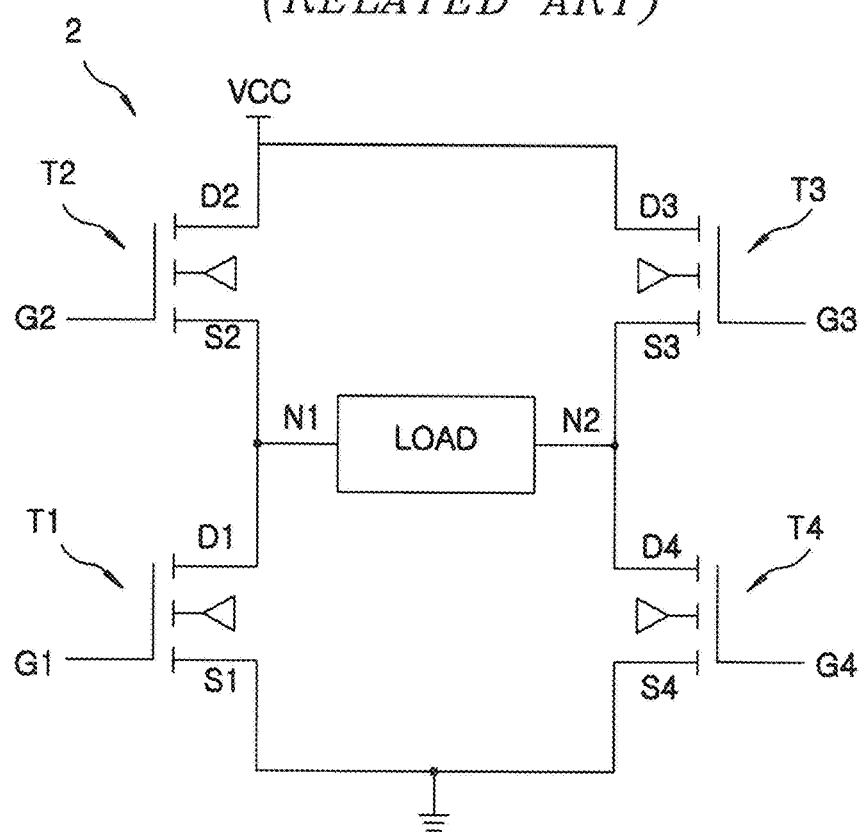
Figure 2:
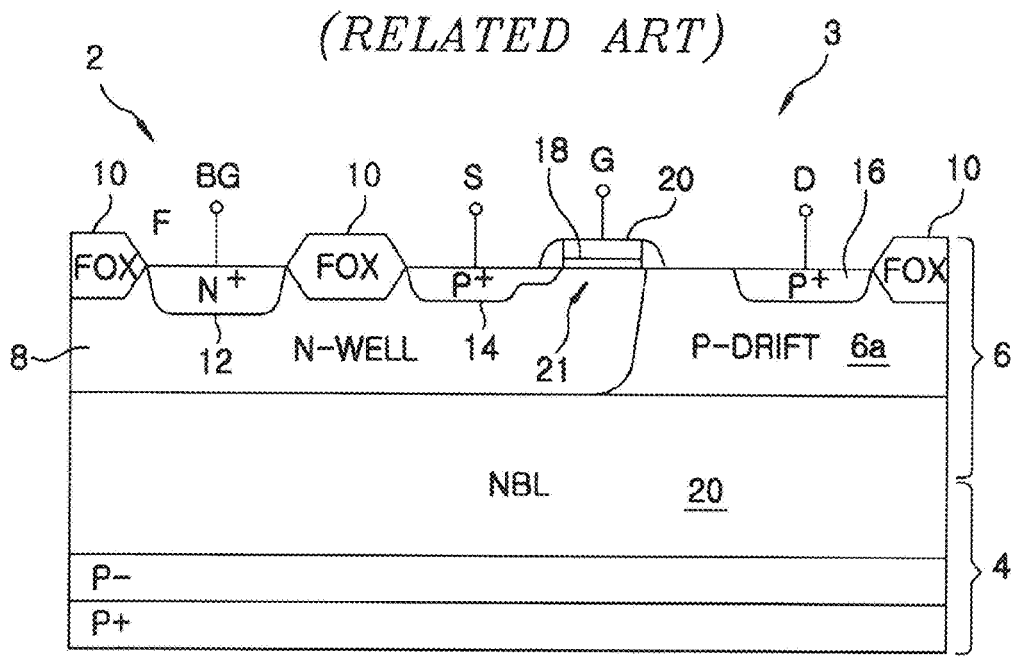
FIG. 2 is a cross-sectional view of a high-side DEPMOS device, in accordance with the related art.

In a half or full H-bridge driver semiconductor device having the above-described configuration, drain region 216 may be coupled to supply voltage VCC and source region 214 may be coupled to a load at intermediate node N1 (e.g. as illustrated in FIG. 1), in accordance with embodiments. In an on-state of high-side DEMOS transistor T2, source region 214 may be pulled up to near supply voltage VCC and NBL 206 may help to prevent punch-through current from flowing between n-well 208 and grounded p-type silicon substrate 202, in accordance with embodiments.

In an off-state, most of supply voltage VCC appears between drain region 216 and source region 214, in accordance with embodiments. In embodiments, since the internal concentration of first NBL 206a is relatively low compared to second NBL 206b, the depletion layer region of the PN junction between p-drift region 204a and NBL 206 may be extended. With an extension of a depletion layer, the breakdown voltage (internal voltage) between drain region 216 and NBL 206 may be increased. Accordingly, the off-state voltage of NBL 204 may become relatively low compared to power supply voltage VCC.

Figure 4A:
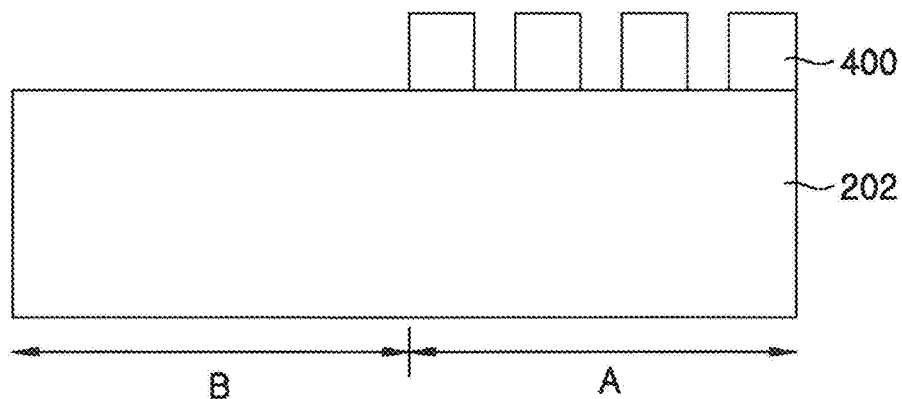
FIGS. 4A to 4F are cross-sectional views illustrating a process of fabricating the p-channel DEMOS transistor, in accordance with embodiments.

FIGS. 4A to 4F are cross-sectional views illustrating a process of forming a p-channel DEMOS transistor, in accordance with embodiments. As illustrated in FIG. 4A, pattern 400 is formed to open a portion of region A and the entire portion of region B in p-doped silicon substrate 202, in accordance with embodiments. In embodiments, region A is where first NBL 206a will he formed and region B is where second NBL 206b will be formed.

Figure 4B:
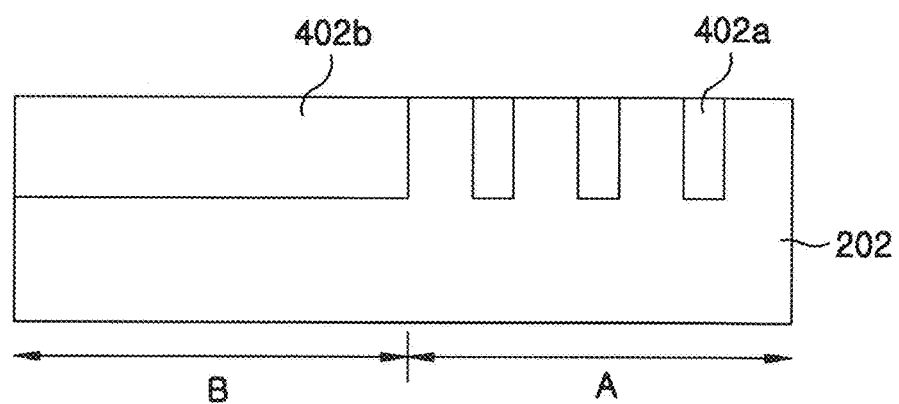

As illustrated in FIG. 4B, n-type dopant regions 402a and 402b may be formed inside silicon substrate 202 through an n-type dopant ion implantation process using pattern 400 as an ion implantation mask. Pattern 400 may then be removed through a stripping process. Accordingly, a plurality of n-type dopant regions 402a may be formed in a guard ring shape inside silicon substrate 202 in region A.

Figure 4C:
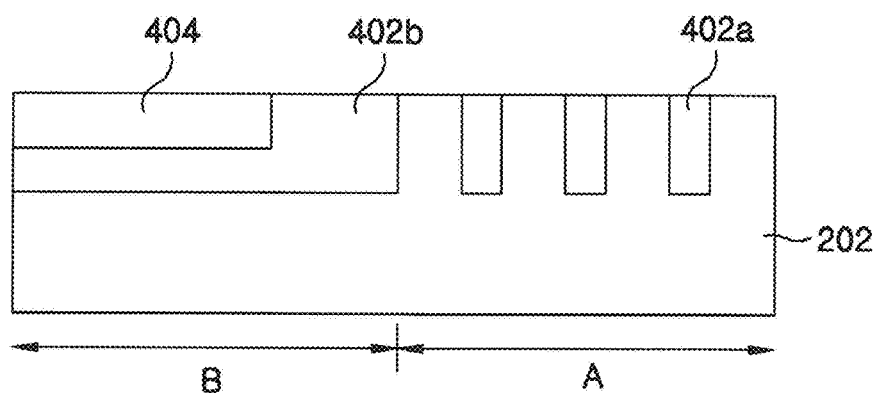

As illustrated in FIG. 4C, a pattern may be formed only on a portion of one-side of region B and a p-type dopant region 404 in n-type dopant region 402b, in accordance with embodiments. In embodiments, p-type dopant region 404 may be formed through a p-type dopant ion implantation process using the pattern as an ion implantation mask. The pattern may be removed through a stripping process.

Figure 4D:
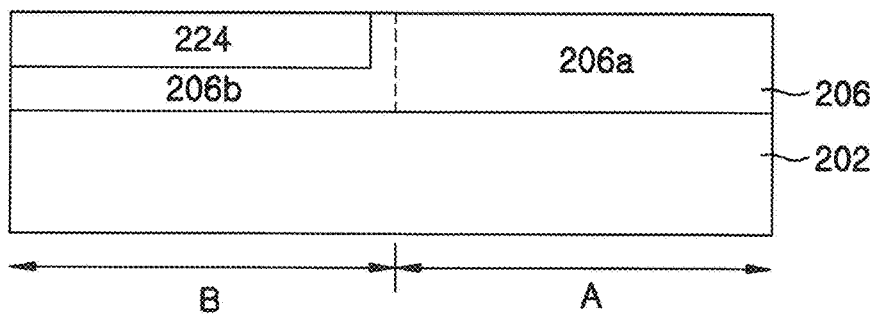

As illustrated in FIG. 4D, a thermal diffusion process may be performed to form first NBL 206a and second NBL 206b in portions of silicon substrate 202, in accordance with embodiments. PBL 224 may be formed in second NBL 206b formed in region B, wherein the concentration of first NBL 206a is relatively low compared to second NBL 206b, in accordance with embodiments. In embodiments, n-type dopant ions in the guard rings formed inside silicon substrate 202 in region B may be diffused during the thermal diffusion process and the n-type dopant ions inside silicon substrate 202 in region A may be diffused, whereby the concentration of first NBL 206a formed in region B is relatively low compared to second NBL 206b formed in region A.

Figure 4E:
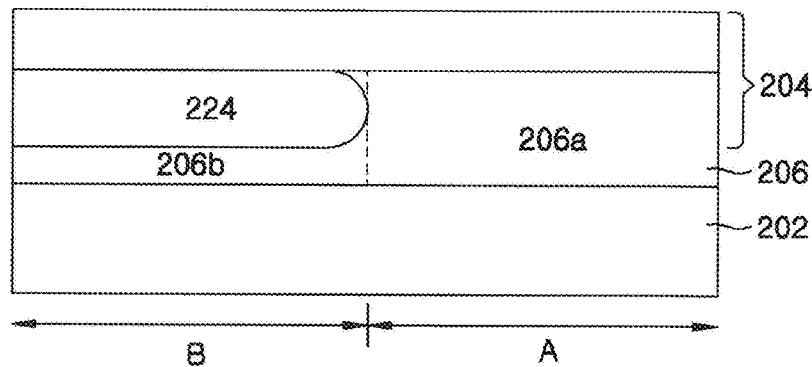

As illustrated in FIG. 4E, p-type epitaxial silicon layer 204 may be formed through an epitaxial growth process, during which first NBL 206a, second NBL 206b, and PBL 224 may be extended to a portion of p-type epitaxial silicon layer 204.

Figure 4F:
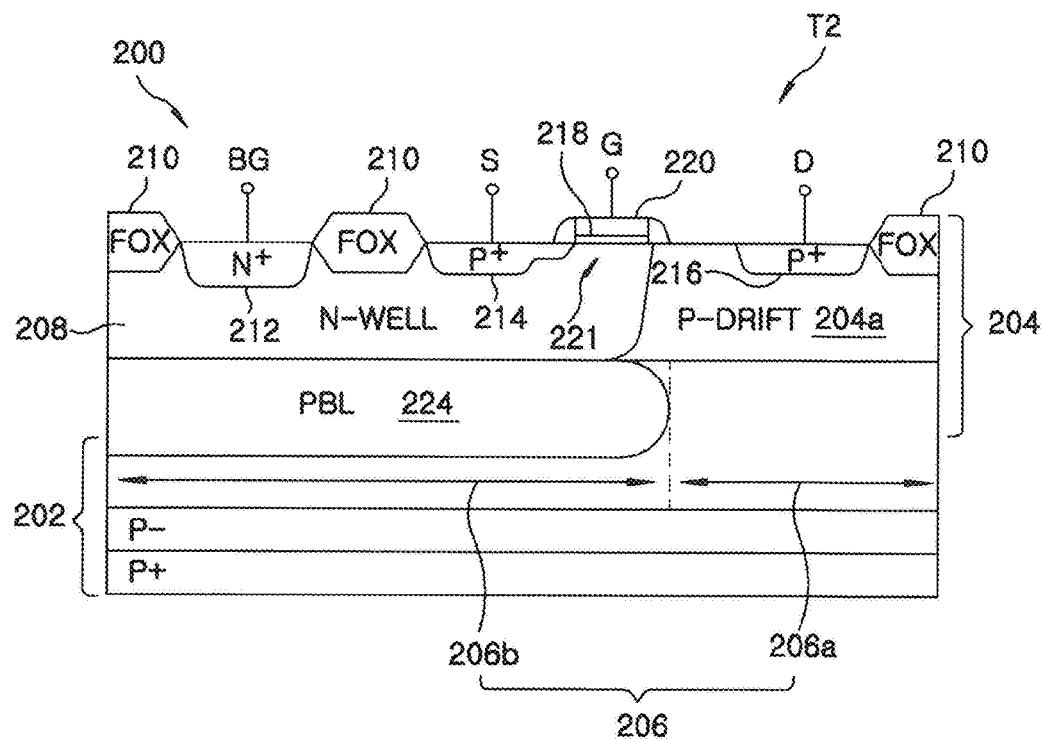

As illustrated in FIG. 4F, n-well 208 may be formed by performing an n-type dopant ion implantation process on epitaxial silicon layer 204 over PBL 224, in accordance with embodiments. Field oxidation layer (FOX) 210, n-type back gate region 212, p-type source, drain region 214, drain region 216, gate oxide layer 218, and gate electrode 220 may be formed through a field oxidation formation process and a gate, source, and drain formation process, in accordance with embodiments.

In accordance with embodiments, buried layers having different concentration distributions are provided that may optimize and/or maximize the breakdown voltage without having to maximize the Rdson or the thickness of an epitaxial silicon layer. In embodiments, with the help of a relatively low concentration in first NBL 206a, a depletion boundary moves downward, thereby further expanding a depletion layer between first NBL 206a and p-drift region 204a. In embodiments, with expansion of the depletion layer, the breakdown voltage (internal voltage) between drain region 216 and first NBL 206a may be optimized and/or maximized. In embodiments, PBL 224 may be formed between second NBL 206b and n-well 208, whereby it is possible to prevent upward diffusion of the n-type impurities of NBL 206.

As described above, in accordance with embodiments, it is possible to maximize the breakdown voltage without unnecessarily maximizing the Rdson and the thickness of the epitaxial silicon layer. While embodiments have been shown and described, embodiments are not limited thereto. It will be understood by those skilled in the art that various changes and modifications may be made without departing from the scope of the embodiments as defined in the following claims.

What is claimed is:

1. A method of fabricating a DEMOS transistor, comprising:
   providing a first conductive type silicon substrate;
   forming a second conductive type buried layer having a different concentration distributions in portion of the silicon substrate;
   forming an epitaxial silicon layer over the silicon substrate;
   defining a second conductive type well and a first conductive type drift region in the epitaxial silicon layer;
   forming a first conductive type source region and a second conductive type back gate in the second conductive type well;
   forming a first conductive type expanded drain in the drift region,
   wherein, in the forming of the second conductive type buried layer, the buried layer is formed such that a first region adjacent to the drift region has a lower dopant concentration than a second region, wherein the second region is outside of the first region.

2. The method of claim 1, wherein the forming of the second conductive type buried layer comprises:
   forming a pattern which opens the portion of the silicon substrate corresponding to the first region and the top of the silicon substrate corresponding to the second region;
   forming a guard ring in the first region and forming a dopant region in the second region by performing a second conductive type dopant ion implantation process using a pattern;
   removing the pattern; and
   performing a thermal diffusion process to form the buried layer, wherein the first region has a relatively low dopant concentration compared to the second region.

3. The method of claim 1, wherein said forming the second conductive type buried layer comprises forming a first conductive type buried layer between the second conductive type well and the second region.

4. The method of claim 1, wherein the first conductive type is p-type and the second conductive type is n-type.

* * * * *